(12) United States Patent
Izumi et al.

(10) Patent No.: US 9,742,110 B2
(45) Date of Patent: Aug. 22, 2017

(54) ELECTRONIC DEVICE

(71) Applicant: YOKOGAWA ELECTRIC CORPORATION, Musashino-shi, Tokyo (JP)

(72) Inventors: Hayato Izumi, Tokyo (JP); Yasuhiro Owaki, Tokyo (JP); Koichiro Shimamura, Tokyo (JP)

(73) Assignee: Yokogawa Electric Corporation, Musashino-shi, Tokyo (JP)

( * ) Notice: Subject to any disclaimer, the term of this patent is extended or adjusted under 35 U.S.C. 154(b) by 221 days.

(21) Appl. No.: 14/600,046

(22) Filed: Jan. 20, 2015

(65) Prior Publication Data

US 2015/0214656 A1 Jul. 30, 2015

(30) Foreign Application Priority Data

Jan. 29, 2014 (JP) .................................. 2014-014666
Sep. 19, 2014 (JP) .................................. 2014-190617

(51) Int. Cl.
| | | |
|---|---|---|
| *H05K 1/14* | (2006.01) | |
| *H01R 13/629* | (2006.01) | |
| *H01R 13/717* | (2006.01) | |
| *H01R 13/68* | (2011.01) | |
| *H01R 24/66* | (2011.01) | |
| *H05K 7/14* | (2006.01) | |

(52) U.S. Cl.
CPC ........... *H01R 13/629* (2013.01); *H01R 13/68* (2013.01); *H01R 13/7175* (2013.01); *H01R 24/66* (2013.01); *H05K 7/1465* (2013.01)

(58) Field of Classification Search
CPC .. H01R 13/629; H01R 13/68; H01R 13/7175; H01R 24/66; H05K 7/1465
See application file for complete search history.

(56) References Cited

U.S. PATENT DOCUMENTS

| | | | |
|---|---|---|---|
| 3,942,077 A | 3/1976 | Powers | |
| 5,249,979 A | 10/1993 | Deinhardt et al. | |
| 5,493,194 A | 2/1996 | Damiano et al. | |
| 5,541,810 A | 7/1996 | Donhauser et al. | |
| 6,172,875 B1 * | 1/2001 | Suzuki .................... | G06F 1/183 361/679.4 |
| 6,456,495 B1 * | 9/2002 | Wieloch ............... | H05K 7/1468 312/215 |
| 2006/0146506 A1 * | 7/2006 | Wu ....................... | G02B 6/4284 361/754 |

(Continued)

FOREIGN PATENT DOCUMENTS

| | | |
|---|---|---|
| DE | 9102101 U1 | 6/1992 |
| DE | 29716575 U1 | 11/1997 |

(Continued)

OTHER PUBLICATIONS

Communication dated Jul. 16, 2015 from the European Patent Office in counterpart European Application No. 15150860.3.

*Primary Examiner* — Yuriy Semenenko
(74) *Attorney, Agent, or Firm* — Sughrue Mion, PLLC

(57) ABSTRACT

An electronic device includes a plug-in module including a printed substrate on which an electronic circuit is mounted, and a baseplate to which the plug-in module is detachably connected, wherein a system side and a field side are connected with each other, and a predetermined option function is included in the plug-in module.

20 Claims, 24 Drawing Sheets

(56) References Cited

U.S. PATENT DOCUMENTS

2009/0083446 A1    3/2009  Konieczny et al.
2014/0152955 A1*   6/2014  Papageorgiou ...... G02B 25/002
                                                     351/159.52

FOREIGN PATENT DOCUMENTS

| DE | 9117303 U1   | 12/1999 |
| EP | 0499675 A1   | 8/1992  |
| EP | 0527247 A1   | 2/1993  |
| EP | 1901598 A1   | 3/2008  |
| EP | 2042953 A2   | 4/2009  |
| JP | 2009-065063 A | 3/2009 |
| JP | 2010-232305 A | 10/2010 |
| JP | 2012-134352 A | 7/2012 |

* cited by examiner

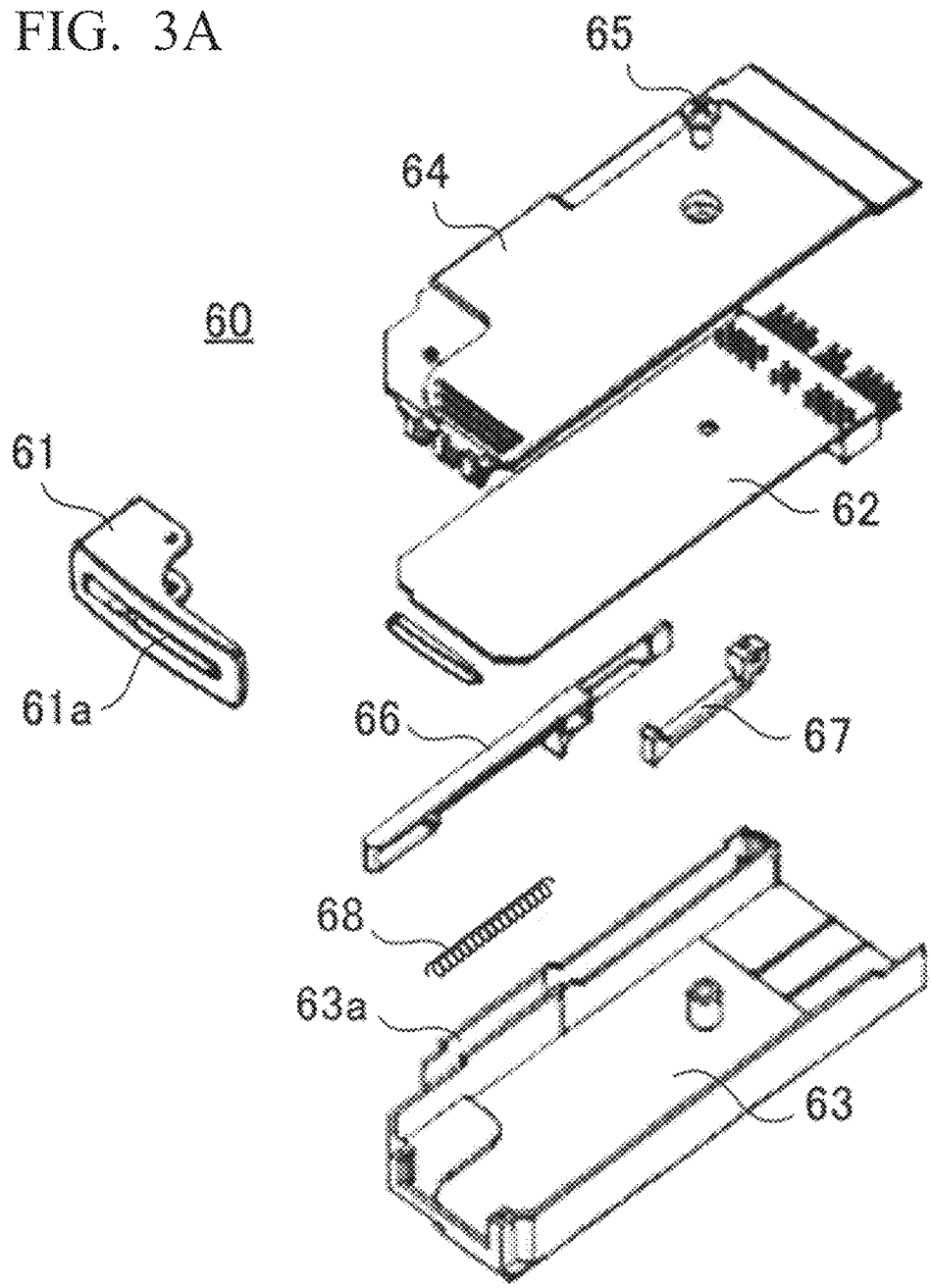

143

144

145

ELECTRONIC DEVICE

BACKGROUND OF THE INVENTION

Field of the Invention

The disclosure relates to an electronic device. More specifically, the disclosure relates to an electronic device in which a plug-in module, which includes a printed substrate on which an electronic circuit is mounted, is detachably connected to a terminal board disposed on a baseplate.

Priorities are claimed on Japanese Patent Application No. 2014-014666, filed Jan. 29, 2014, and Japanese Patent Application No. 2014-190617, filed Sep. 19, 2014, the contents of which are incorporated herein by reference.

Description of Related Art

As a type of an electronic device, there is a device in which a plurality of plug-in modules, which include a printed substrate on which an electronic circuit is mounted, is detachably connected to a terminal board disposed on a baseplate.

FIG. 11 is a drawing illustrating an example of a control system including the electronic device. As shown in FIG. 11, a field control station 10 communicates with various types of computers such as a remote operation monitoring server, a human interface station, an SMTP (Simple Mail Transfer Protocol) server, an engineering station, a safety control station, an advanced process control station, an integration gateway station, and a general-purpose subsystem gateway. The field control station 10 is detachably connected to a first terminal board in which input-output modules 11 and various types of function modules 12 are disposed on a baseplate (not shown). For example, the function modules 12 are such as a control module which controls transmitting/receiving various types of signals to/from a host system and an electrical power supply module.

The field control station 10 is connected to a second terminal board 30 with a cable 20. For example, a connector 31 to which the cable 20 of a system side is detachably connected, a terminal block 32 to which a cable of a field side is connected, and a disconnecting member 33 are disposed on the second terminal board 30. The terminal block 32 is connected to a field device (for example, a sensing device, a motor, and a valve) with the cable of the field side. The disconnecting member 33 mechanically disconnects, if needed, a signal connection between the connector 31 and the terminal block 32.

FIG. 12 is a drawing illustrating the second terminal board 30. FIG. 13 is a circuit block diagram of the second terminal board 30. In the second terminal board 30, for example, a wiring member which is capable of being inserted and ejected with a connector is used as the disconnecting member 33.

For example, when the system is started-up or the system is maintained, the disconnecting member 33 checks a state of the signal connections of the system side and a state of the signal connections of the field side individually. The signal input-output connection between the system side and the field side is disconnected mechanically by ejecting the disconnecting member 33 from the second terminal board 30.

The fuse 34 fuses to protect the signal connection when a large current which is more than a predetermined current flows. The fuse 34 is series-connected to the disconnecting member 33. In addition to these components, if needed, auxiliary components such as a relay and an LED (Light Emitting Diode) are mounted on the second terminal board 30.

The circuit of the second terminal board 30 is divided into a left block and a right block. Channels 1 through 16 are disposed in the left block. Channels 17 through 32 are disposed in the right block. A series circuit which is equipped with the disconnecting member 33 and the fuse 34 is disposed in each of the channels. The disconnecting members 33a and the fuses 34a are disposed in the channel 1 through 16. The disconnecting members 33b and the fuses 34b are disposed in the channel 17 through 32.

A duplexed electrical power supply block 35 for driving the left block and the right block is disposed under the left block and the right block.

Also, as shown in FIG. 14A through FIG. 14E, there are electronic devices which are terminal blocks separated from the second terminal board 30. An electronic device 141 shown in FIG. 14A, an electronic device 142 shown in FIG. 14B, and an electronic device 143 shown in FIG. 14C are disconnecting terminal blocks mounted on a DIN (Deutsche Industrie Normen) rail. An electronic device 144 shown in FIG. 14D and an electronic device 145 shown in FIG. 14E are relay terminal blocks mounted on a terminal board.

In Japanese Unexamined Patent Application Publication No. 2012-134352, a terminal board, which can be fixed on a DIN rail in a small space without sliding laterally, is described. A substrate of the terminal board can be stored in a metallic case.

However, conventionally, the field control station 10, which is equipped with the input-output modules 11 and the function modules 12, and the second terminal board 30, which is equipped with the disconnecting member 33 and the fuse 34, are separated. For the reason, in a case of an operation check when establishing a system or in a case of a maintenance check after establishing the system, a measurement check should be performed by selecting the signal connections of the channels of the field control station 10 and the second terminal board 30 and checking the selected signal connections. Therefore, there is a problem that the work is complicated. Especially, in a case of a large-scale system having many channels, man-hour of the work is to be much more.

Also, because the field control station 10 and the second terminal board 30 are separated with each other, there is a problem of increasing a number of components and assembly time and increasing costs.

Also, in a case where the control system is established by using the field control station 10 and the second terminal board 30, there is a problem that a space for disposing the field control station 10 and the second terminal board 30 is needed.

Further, because the field control station 10 and the second terminal board 30 are connected with the cable 20, in a case of a large-scale system having many control objects, there is a problem that cables are congested and the works such as a control system establishment and a maintenance check are complicated.

SUMMARY

An electronic device may include a plug-in module including a printed substrate on which an electronic circuit is mounted, and a baseplate to which the plug-in module is detachably connected, wherein a system side and a field side are connected with each other, and a predetermined option function is included in the plug-in module.

BRIEF DESCRIPTION OF THE DRAWINGS

FIG. 3A is a drawing illustrating an exploded perspective view of the plug-in module 60.

DETAILED DESCRIPTION OF THE EMBODIMENTS

The embodiments of the present invention will be now described herein with reference to illustrative preferred embodiments. Those skilled in the art will recognize that many alternative preferred embodiments can be accomplished using the teaching of the present invention and that the present invention is not limited to the preferred embodiments illustrated herein for explanatory purposes.

Object of some embodiments of the present invention is to provide a comparatively inexpensive electronic device which can reduce mounting space and perform a system establishment and a maintenance check efficiently.

Another object of some embodiments of the present invention is to provide an electronic device in which a plurality of plug-in modules, which include a printed substrate on which an electronic circuit is mounted, is detachably connected to a terminal board disposed on a baseplate, and the electronic device can stop temporarily and surely before and after connecting to a connector in a case where the plug-in modules are inserted or ejected.

First Embodiment

Figure 1A:
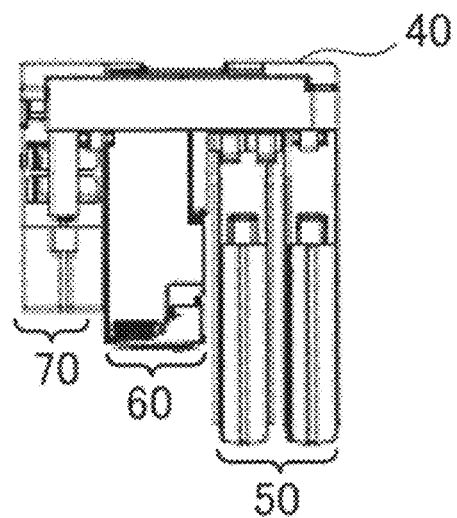
FIG. 1A is a drawing illustrating a top view of the electronic device.
Figure 1B:
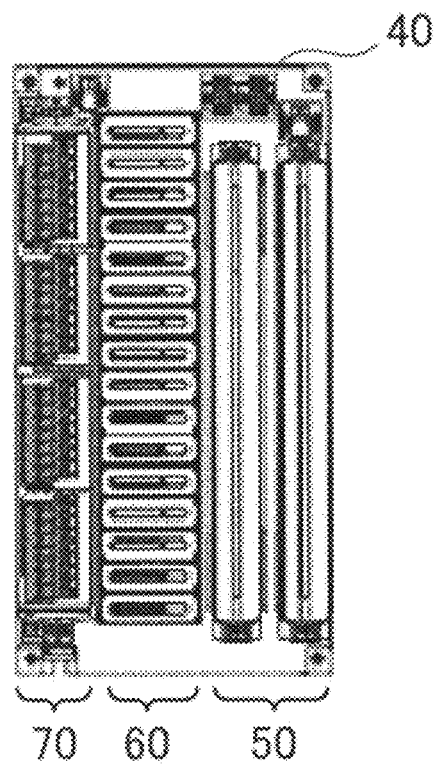
FIG. 1B is a drawing illustrating a front view of the electronic device.
Figure 1C:
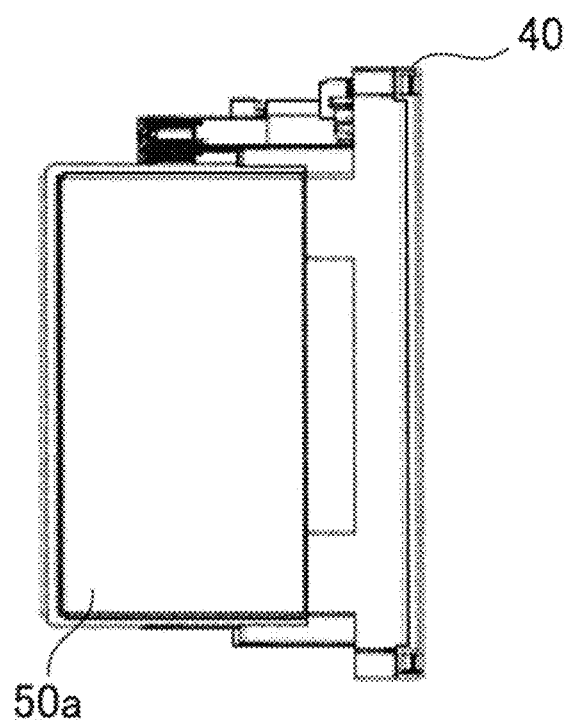
FIG. 1C is a drawing illustrating a right side view of the electronic device.
Figure 1D:
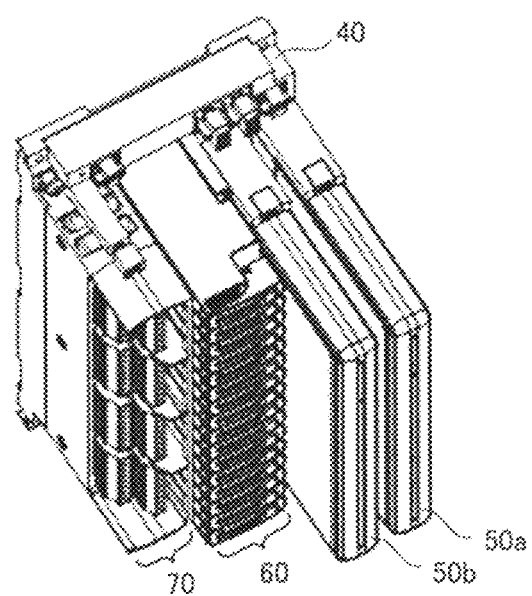
FIG. 1D is a drawing illustrating a perspective view of the electronic device.

FIG. 1A is a drawing illustrating a top view of the electronic device. FIG. 1B is a drawing illustrating a front view of the electronic device. FIG. 1C is a drawing illustrating a right side view of the electronic device. FIG. 1D is a drawing illustrating a perspective view of the electronic device.

As shown in FIGS. 1A through 1D, two input-output modules 50 which have same functions, a plurality of plug-in modules 60 each of which has a predetermined optional function, and a plurality of terminal blocks 70 are detachably connected to a baseplate 40 with connectors (not shown) respectively.

As shown in FIG. 1A, in a case where the two input-output modules 50, the plug-in modules 60, and the terminal blocks 70 are mounted on the baseplate 40, the depth of the two input-output modules 50 is longer than the depth of the plug-in modules 60, and the depth of the plug-in modules 60 is longer than the depth of the terminal blocks 70.

The two input-output modules 50 communicate with a host device. The terminal blocks 70 are equipped with terminals and a supporter which supports the terminals. The terminal blocks 70 are connected to field devices (for example, a sensing device, a motor, and a valve) with the cable.

The two input-output modules 50a and 50b are operated in two modes (ACT/STAND BY). In a case where one input-output module (for example, 50a) which operates as a master is broken, another input-output module (for example, 50b) which operates as a slave is to operate as a master alternatively. In this way, the two duplexed input-output modules 50a and 50b are driven. Therefore, an operation stop caused by the broken input-output modules 50 can be suppressed to a minimum.

The plug-in modules 60 assign the optional functions such as a signal conversion function, an insulation function, a disconnect function, and a fuse function to each of the signal connections individually. In a front of the plug-in modules 60, one end of a front lever 61 is mounted rotatably with respect to an axis. The front lever 61 is mounted with covering the front of the plug-in modules 60. Specific examples of the plug-in modules 60 will be described later.

For example, by assigning the optional function such as the disconnect function to the plug-in module 60, the disconnecting member 33 disposed in the second terminal board 30 can be omitted. Also, by assigning the optional function such as the fuse function to the plug-in module 60, the fuse 34 disposed in the second terminal board 30 can be omitted.

The fuse function, which is assigned to the plug-in modules 60 as the optional function, may be a simple fuse or a fuse having the disconnect function.

Figure 2A:
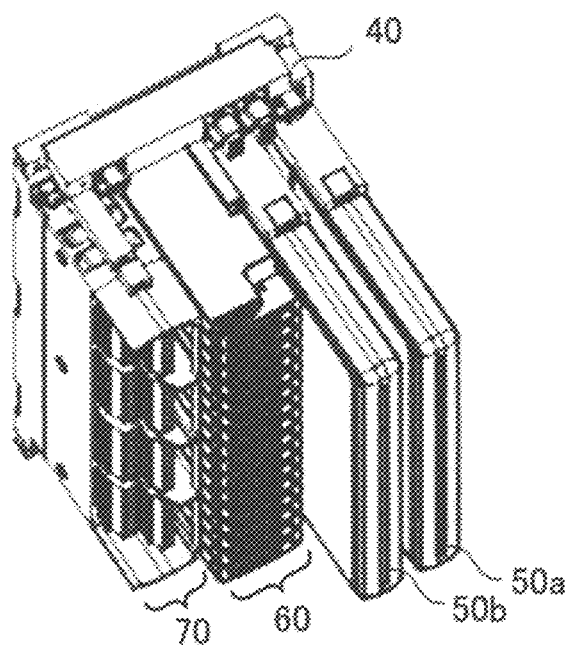
FIG. 2A is a drawing illustrating the electronic device in which all of the sixteen plug-in modules 60 are connected to the baseplate 40.

FIG. 2A is a drawing illustrating the electronic device in which all of the sixteen plug-in modules 60 are connected to the baseplate 40. The front levers 61 of the plug-in modules 60 cover the front of the plug-in modules 60 respectively.

In a case where an abnormality is observed at the signal communication of the fifth top plug-in module 60, there is a need to identify the cause of the abnormality. Therefore, a worker assumes that the fifth top plug-in module 60 may be broken, and the worker inserts a substitute plug-in module 60, which has the same function as the fifth top plug-in module 60, instead of the fifth top plug-in module 60. After that, the worker checks whether the electronic device is recovered to a normal state or not.

Figure 2B:
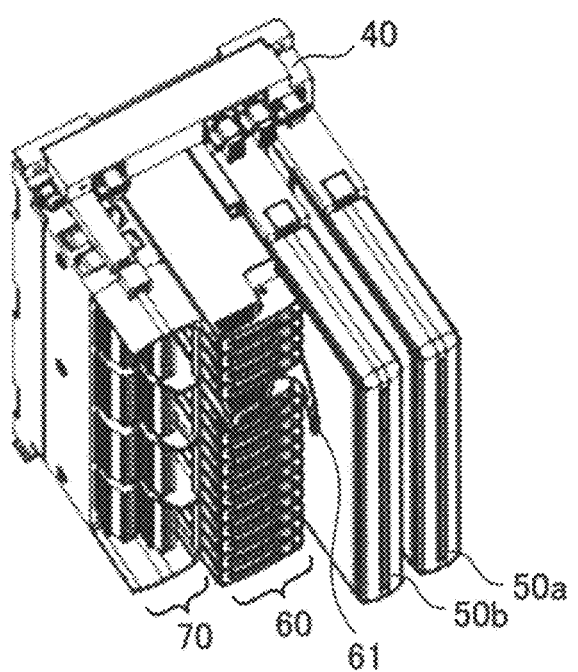
FIG. 2B is a drawing illustrating the electronic device in which the front lever 61 of the fifth top plug-in module 60 is rotated counterclockwise, and the plug-in module 60 is pulled out to the front direction.

FIG. 2B is a drawing illustrating the electronic device in which the front lever 61 of the fifth top plug-in module 60, of the sixteen plug-in module 60 mounted on the baseplate 40, is rotated counterclockwise, and the plug-in module 60 is pulled out to the front direction. By pulling out the front lever 61 to the front direction, the connection between the connector disposed on the baseplate 40 and the plug-in module 60 is released, and the signal connection between the system side and the field side of the fifth top plug-in module 60 is blocked.

Figure 2C:
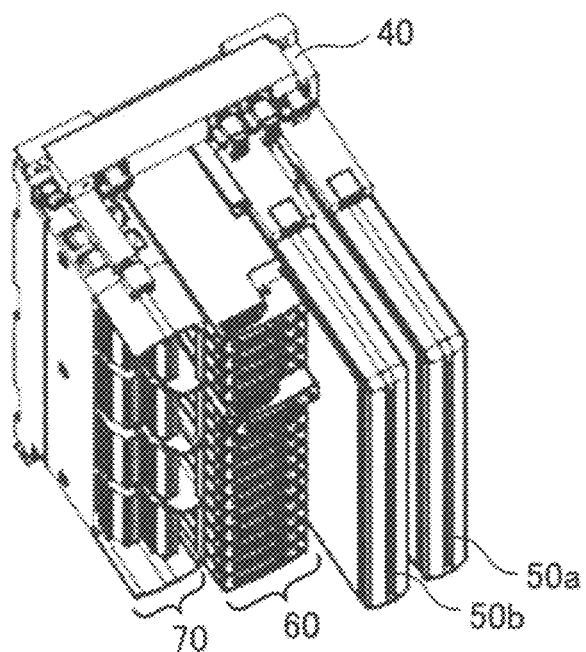
FIG. 2C is a drawing illustrating the electronic device in which the front lever is released and the front lever covers the front of the fifth top plug-in module 60 again.

FIG. 2C is a drawing illustrating the electronic device in which the front lever is released and the front lever covers the front of the fifth top plug-in module 60 again. The signal connection between the system side and the field side of the fifth top plug-in module 60 is kept to be blocked until the fifth top plug-in module 60 is connected to the connector disposed on the baseplate 40 again.

Figure 2D:
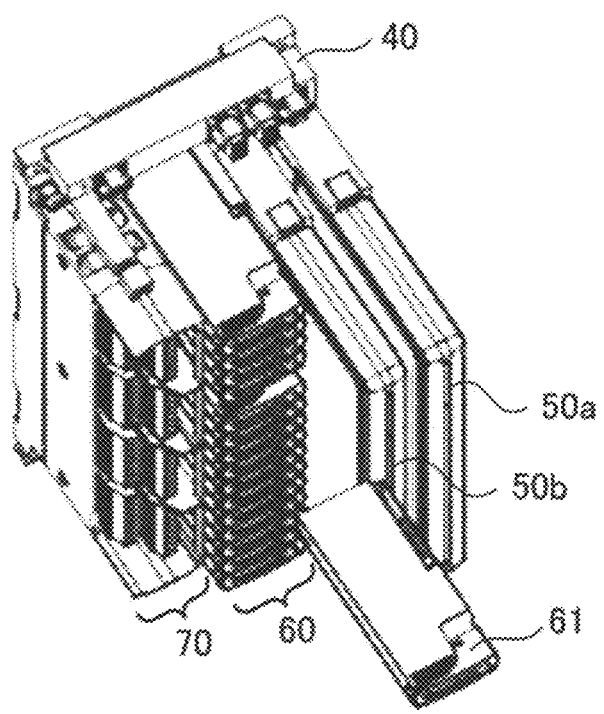
FIG. 2D is a drawing illustrating the electronic device in which the fifth top plug-in module 60 is ejected to the front direction.

FIG. 2D is a drawing illustrating the electronic device in which the fifth top plug-in module 60 is ejected to the front direction. After the fifth top plug-in module 60 is ejected, if needed, the worker inserts a substitute plug-in module 60, which has the same function as the fifth top plug-in module 60, instead of the fifth top plug-in module 60.

In a case of mounting the substitute plug-in module 60, the worker inserts the substitute plug-in module 60 until the substitute plug-in module 60 is connected to the connector disposed on the baseplate 40. When the substitute plug-in module 60 is connected to the connector disposed on the baseplate 40, the electronic device becomes to the state shown in FIG. 2A again.

In a case where the signal connection of the fifth top plug-in module 60 is not recovered to a normal state despite of mounting the substitute plug-in module 60 which has the same function as the broken plug-in module 60 and operates normally, the worker assumes that a device other than the fifth top plug-in module 60 may be broken.

Figure 3B:
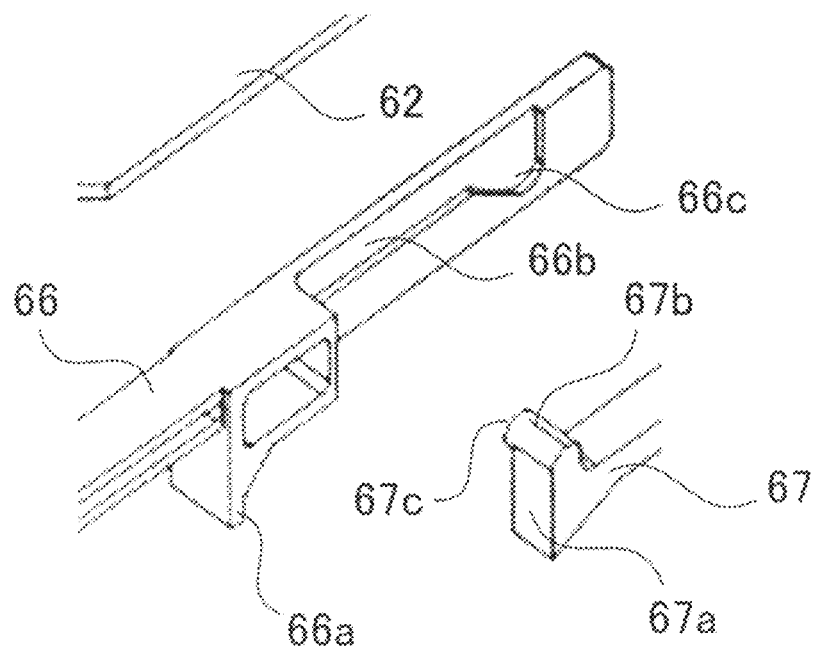
FIG. 3B is a drawing illustrating a magnified view of a part of FIG. 2A.

FIG. 3A is a drawing illustrating an exploded perspective view of the plug-in module 60. FIG. 3B is a drawing illustrating a magnified view of a part of FIG. 2A. In FIGS. 3A and 3B, to understand easily, the plug-in module 60 is illustrated upside down.

As shown in FIG. 3A, the connector connected to the baseplate 40 and parts of the electrical circuit are mounted on a printed substrate 62. The printed substrate 62 is stored in a case which is formed to be box-shaped with an upper cover 63 and a lower cover 64 and fixed with a screw 65. The front lever 61 which covers the front of the plug-in module 60 is rotatably mounted on the front of the box-shaped case.

The front lever 61 is mounted on a left side of the front of the plug-in module 60 with an axis so as to rotate clockwise and open in a state that the plug-in module 60 is mounted on the baseplate 40. Although the front lever 61 opens by rotating clockwise in FIG. 3A, because the plug-in module 60 is illustrated upside down, the front lever 61 opens by rotating counterclockwise in a real disposition state (FIG. 1A through 1D, FIG. 4A through 4E, and FIG. 5A through 5E). In the other words, the front lever 61 opens by rotating from a side of the terminal block 70 to a side of the input-output module 50b.

In a state that the input-output module 50 and the plug-in module 60 are mounted on the baseplate 40, such constitution makes it possible for the worker to rotate the front lever 61 smoothly despite of the input-output module 50 which projects more than the plug-in module 60.

A slit-shaped window 61a is disposed in the front lever 61 for observing inside of the plug-in module 60. If needed, the window 61a may be equipped with a magnifying lens so as to improve visibility.

The front lever 61 is formed to be a predetermined shape with elastic synthetic resin. In a case where the front lever 61 is forced to open heavily, the front lever 61 comes free from the axis of the case. For the reason, the breakdown of the plug-in module 60 can be prevented.

A guide trough 63a is formed on an internal side wall of the upper cover 63 along a longitudinal direction from a front side to a back side of the upper cover 63. The guide trough 63a is formed so that a latch drive mechanism can be mounted to be movable in conjunction with the rotation of the front lever 61.

The latch drive mechanism, which is mounted on the guide trough 63a, includes a link bar 66, a latch 67, and a spring 68.

A projection 66a is formed on the link bar 66. The projection 66a acts as a fulcrum point with respect to the guide trough 63a. A cut trough 66b is formed in the link bar 66 along a depth direction. The cut trough 66b latches one end of the latch 67. A notch 66c is formed at the end of the cut trough 66b in the depth direction.

An end plane 67a of the latch 67 is a vertical plane perpendicular to the longitudinal direction. An upper side 67b of the end plane 67a is formed to be arc-shaped. A column-shaped projection 67c for latching the cut trough 66b is disposed on a facing plane of the upper side 67b facing to the link bar 66. The column-shaped projection 67c is latched to the cut trough 66b of the link bar 66, and the latch 67 is slidably connected to the link bar 66.

Figure 4A:
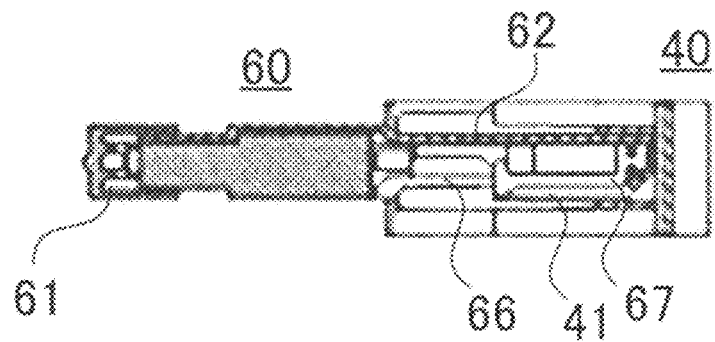
FIG. 4A is a drawing illustrating a sectional view on the line A-A illustrated in FIG. 4C.
Figure 4B:
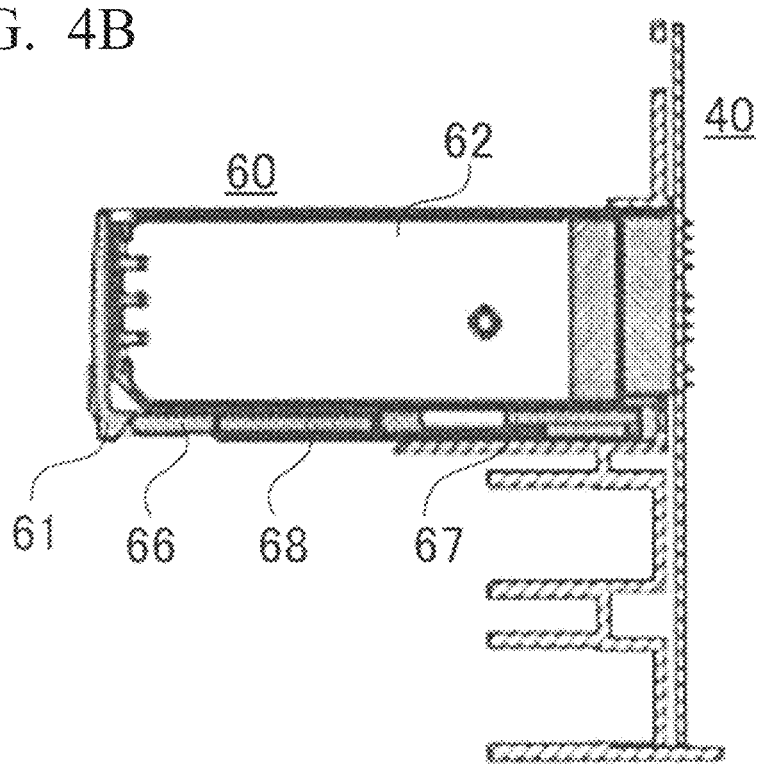
FIG. 4B is a drawing illustrating a sectional view on the line B-B illustrated in FIG. 4D.
Figure 4C:
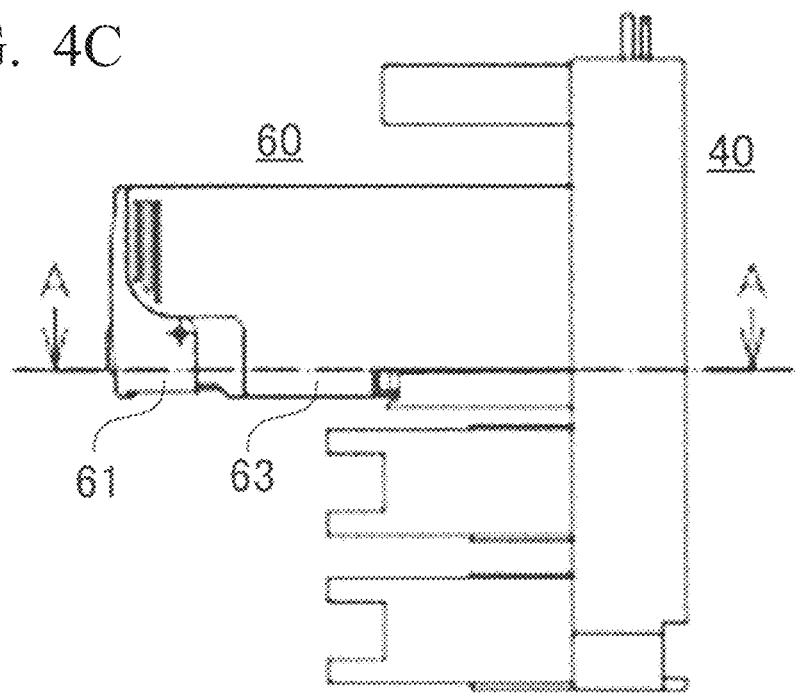
FIG. 4C is a drawing illustrating a top view of the plug-in module 60.
Figure 4D:
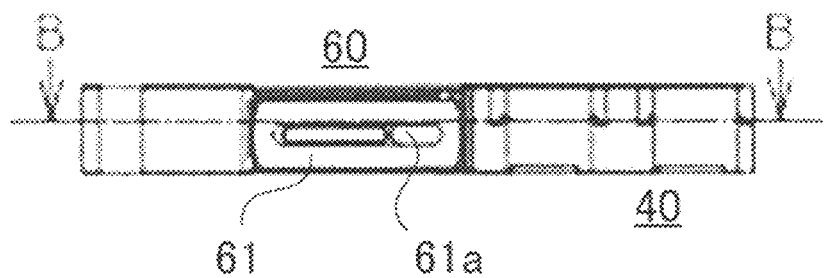
FIG. 4D is a drawing illustrating a front view of the plug-in module 60.
Figure 4E:
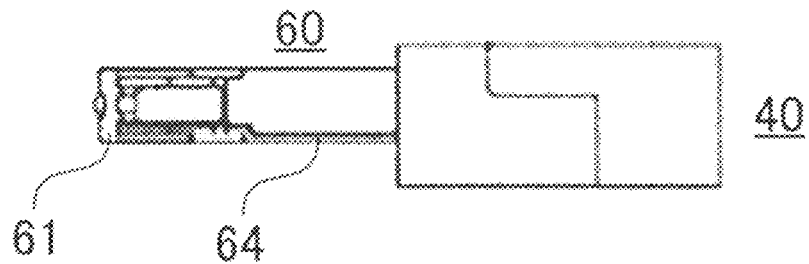
FIG. 4E is a drawing illustrating a side view of the plug-in module 60.

FIG. 4A through FIG. 4E are drawings illustrating the plug-in module 60 connected to the baseplate 40. FIG. 4A is a drawing illustrating a sectional view on the line A-A illustrated in FIG. 4C. FIG. 4B is a drawing illustrating a sectional view on the line B-B illustrated in FIG. 4D. FIG. 4C is a drawing illustrating a top view of the plug-in module 60. FIG. 4D is a drawing illustrating a front view of the plug-in module 60. FIG. 4E is a drawing illustrating a side view of the plug-in module 60.

A stepped section 41 is disposed near an aperture on the baseplate 40 so as to prevent the plug-in module 60 from pulling out. When the plug-in module 60 is inserted to the baseplate 40, a connector disposed on the printed substrate 62 of the plug-in module 60 is connected to a connector disposed on the baseplate 40. The latch 67 is slid along the baseplate 40 with latching the column-shaped projection 67c to the cut trough 66b of the link bar 66. The latch 67 engages with the notch 66c formed at the end of the cut trough 66b in the depth direction. The front lever 61 is pressed by the spring 68 via the link bar 66 so as to cover the front of the case.

In a case where the worker tries to pull out the plug-in module 60 from the baseplate 40 in a state that the plug-in module 60 is fixed to the baseplate 40, as shown in FIG. 4A, because the end plane 67a of the latch 67 comes into contact with the stepped section 41 disposed on the baseplate 40, the plug-in module 60 cannot be pulled out. For the reason, the connectors are engaged with each other stably.

Figure 5A:
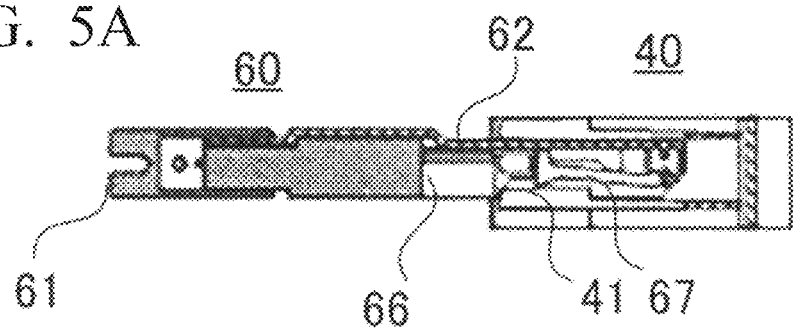
FIG. 5A is a drawing illustrating a sectional view on the line A-A illustrated in FIG. 5C.
Figure 5B:
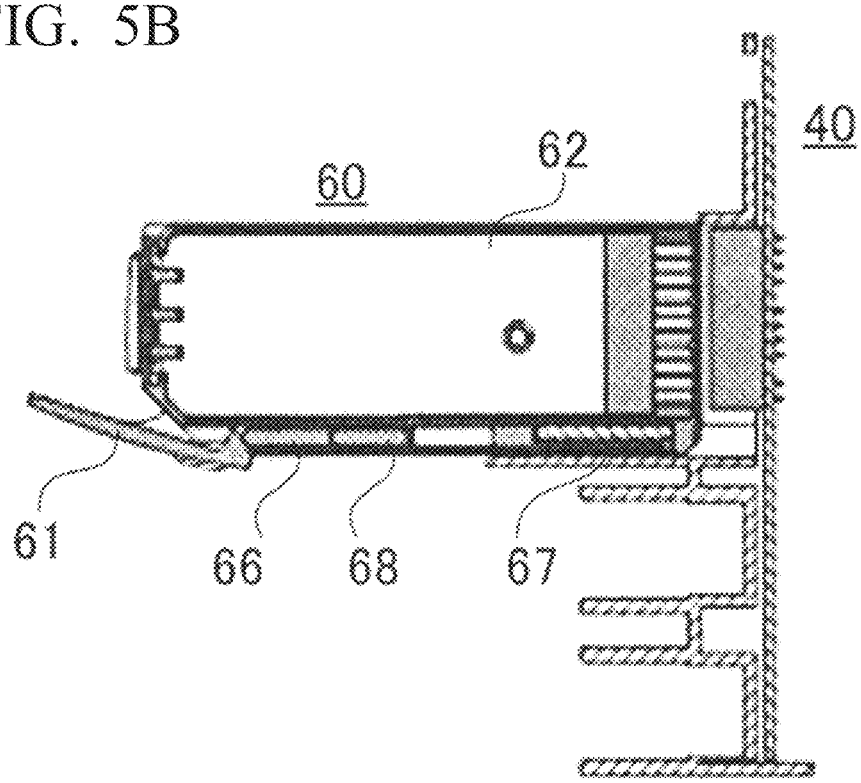
FIG. 5B is a drawing illustrating a sectional view on the line B-B illustrated in FIG. 5D.
Figure 5C:
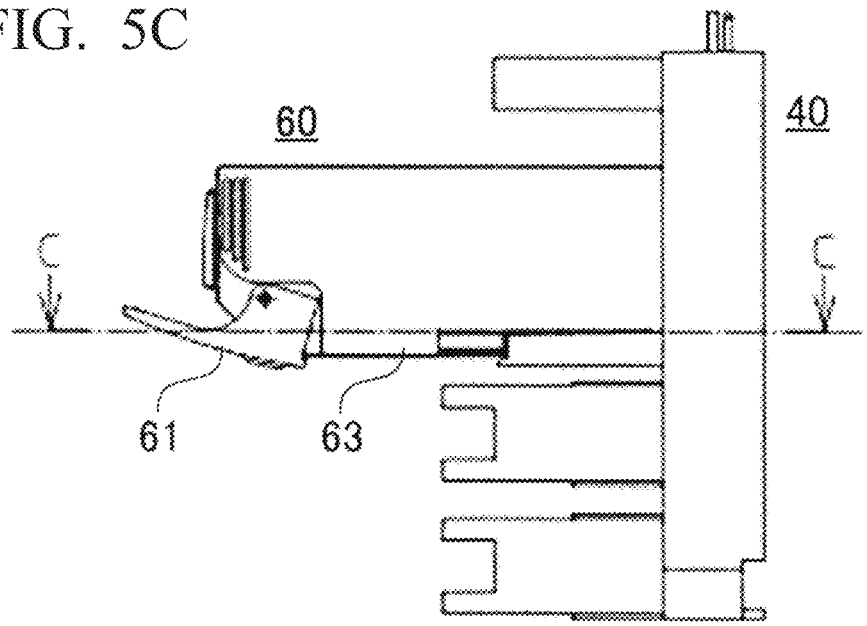
FIG. 5C is a drawing illustrating a top view of the plug-in module 60.
Figure 5D:
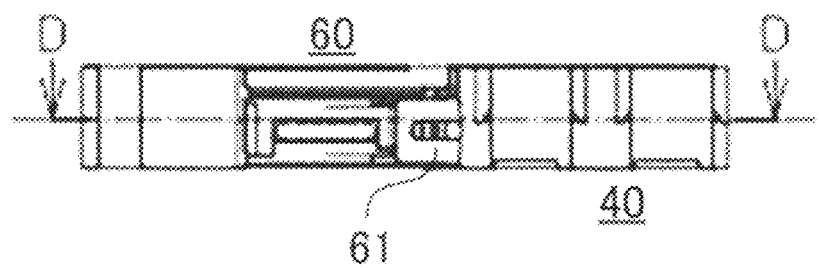
FIG. 5D is a drawing illustrating a front view of the plug-in module 60.
Figure 5E:
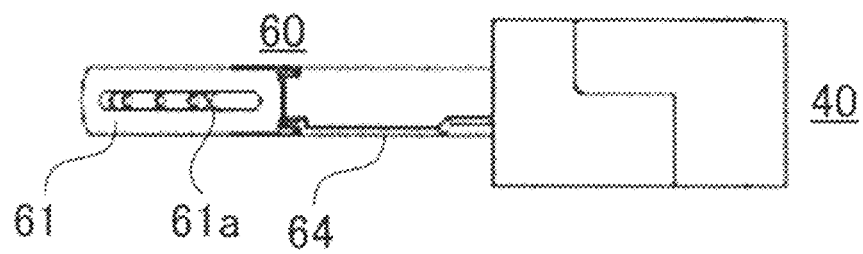
FIG. 5E is a drawing illustrating a side view of the plug-in module 60.

FIG. 5A through FIG. 5E are drawings illustrating the plug-in module 60 in a case where the connection between the plug-in module 60 and the baseplate 40 is released. FIG. 5A is a drawing illustrating a sectional view on the line A-A illustrated in FIG. 5C. FIG. 5B is a drawing illustrating a sectional view on the line B-B illustrated in FIG. 5D. FIG. 5C is a drawing illustrating a top view of the plug-in module 60. FIG. 5D is a drawing illustrating a front view of the plug-in module 60. FIG. 5E is a drawing illustrating a side view of the plug-in module 60.

As shown in FIG. 5B and FIG. 5C, when the worker opens the front of the case by rotating, to the counterclockwise direction, the front lever 61 of the plug-in module 60 against the elastic force of the spring 68, the link bar 66 slides to the depth direction.

At the time, because a comparative positional relation between the link bar 66 and the baseplate 40 is not changed, the connection between the connector of the baseplate 40 and the connector of the plug-in module 60 is released. The plug-in module 60 which is connected to the front lever 61 is ejected to the front direction with the projection 66a as a fulcrum point. The signal connection between the baseplate 40 and the plug-in module 60 is disconnected.

The end plane 67a of the latch 67, which is latched to the notch 66c formed at the end of the cut trough 66b, rotates and moves along the cut trough 66b with the link bar 66 sliding to the depth direction. The end plane 67a of the latch 67 moves along an upper plane of the stepped section 41, and the end plane 67a of the latch 67 slides to the front direction.

As shown in FIG. 5A, the connection between the connector disposed on the printed substrate 62 of the plug-in module 60 and the connector disposed on the baseplate 40 is released. However, because the plug-in module 60 is positioned on a guide member (not shown) which is disposed in the baseplate 40, the plug-in module 60 is held without being pulled out from the baseplate 40.

The front lever 61 is returned to the position covering the front of the case by a reaction force of the spring 68 at the time when the front lever 61 is rotated counterclockwise against the elastic force of the spring 68.

Such constitution makes it possible to provide easily, for example, a fuse having the disconnect function, an LED having the disconnect function, and a relay having the disconnect function by adding a function such as a fuse, an LED, and a relay to the plug-in module 60.

The field control station 10 and the second terminal board 30 are integrated with each other as an electronic device. For the reason, in a case of the operation check when establishing the system or in a case of the maintenance check after establishing the system, the worker can perform the measurement check by selecting only the signal connections of the channels as a measurement target and checking the selected signal connections instead of selecting the signal connections of the channels of the field control station 10 and the second terminal board 30 as measurement target and checking the selected signal connections. Therefore, man-hour of the work can be reduced, and the system establishment and the maintenance check are performed efficiently.

Also, in a case of establishing the control system, because the series circuit which is equipped with a disconnecting member and a fuse is omitted, the mounting space can be reduced.

Second Embodiment

Figure 6:
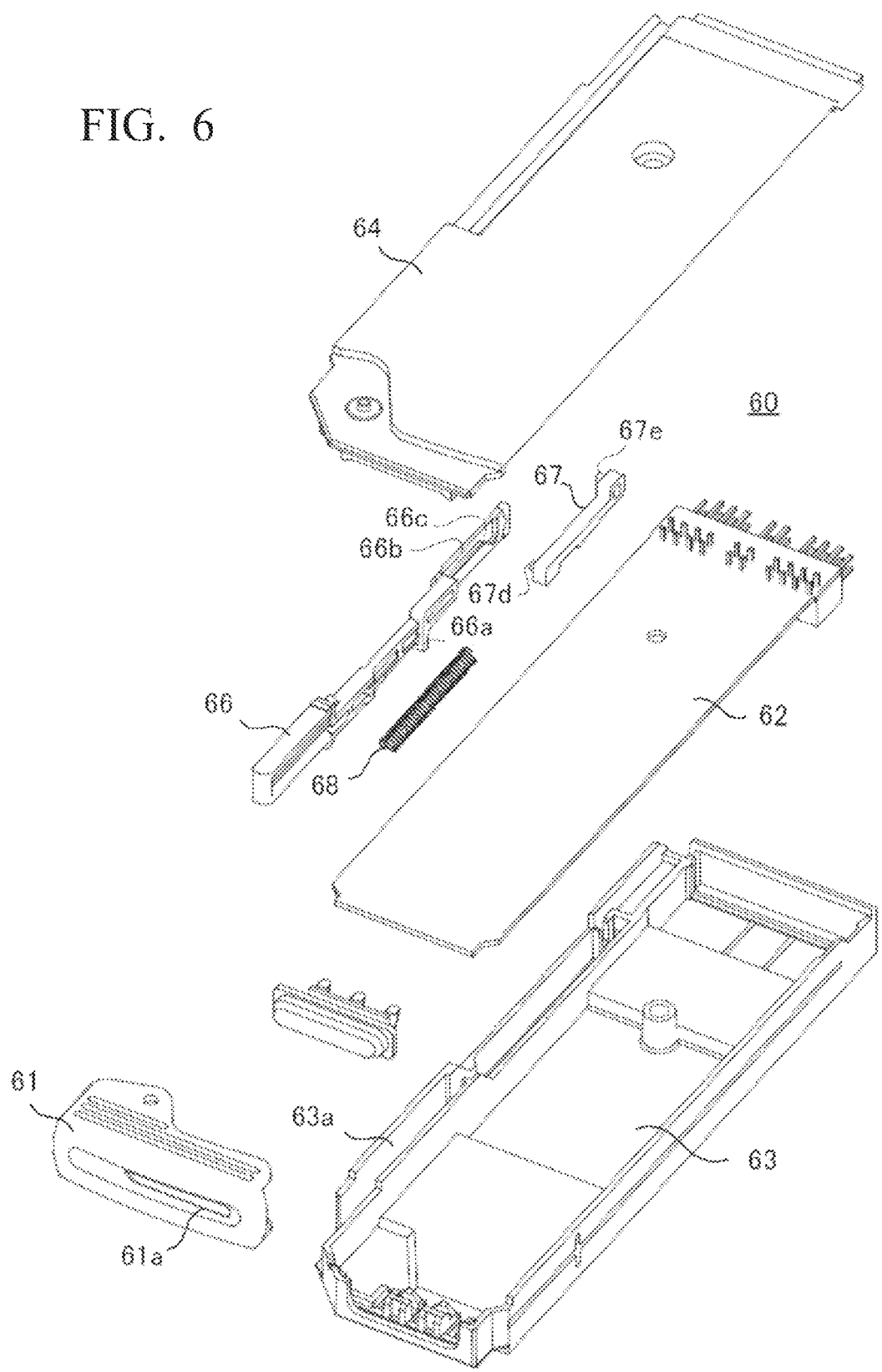
FIG. 6 is a drawing illustrating an exploded perspective view of the plug-in module 60 in a second embodiment.

FIG. 6 is a drawing illustrating an exploded perspective view of the plug-in module 60 in a second embodiment. In this drawing, parts that correspond to those in FIG. 3 are assigned the same reference numerals, and the descriptions thereof will be omitted. Differences between FIG. 6 and FIG. 3 are specific constitutions of the link bar 66 and the latch 67.

In the second embodiment, the link bar 66, the latch 67, and the baseplate 40 are changed. By the change, in a case of inserting or ejecting the plug-in module 60, as shown in FIG. 7 through FIG. 10, the plug-in module 60 can stop temporarily and surely before the plug-in module 60 is connected to the connector of the baseplate 40 and after the plug-in module 60 is disconnected from the connector of the baseplate 40.

An end 67d of the latch 67 is slidably latched to the cut trough 66b. The link bar 66 and the latch 67 is stored in the guide trough 63a of the upper cover 63 with the link bar 66 being pressed to the front direction by the spring 68.

Another end 67e is rotatably mounted on a mounting notch 63b formed near the end of the guide trough 63a in the depth direction. A notch 67f is formed in a facing plane of the latch 67 facing to the guide trough 63a. In a case of inserting or ejecting the plug-in module 60, the notch 67f engages with a projection 42 before the plug-in module 60 is connected to the connector of the baseplate 40 and after the plug-in module 60 is disconnected from the connector of the baseplate 40. For the reason, the notch 67f performs as an intermediate stopper which temporarily stops the movement of the plug-in module 60.

FIG. 7 through FIG. 10 are drawings illustrating operations of inserting and ejecting the plug-in module 60. FIG. 7A is a drawing illustrating a top view of the plug-in module 60. FIG. 7B is a drawing illustrating a sectional view on the line A-A illustrated in FIG. 7A. FIG. 8A is a drawing illustrating a top view of the plug-in module 60. FIG. 8B is a drawing illustrating a sectional view on the line A-A illustrated in FIG. 8A. FIG. 9A is a drawing illustrating a top view of the plug-in module 60. FIG. 9B is a drawing illustrating a sectional view on the line A-A illustrated in FIG. 9A. FIG. 10A is a drawing illustrating a top view of the plug-in module 60. FIG. 10B is a drawing illustrating a sectional view on the line A-A illustrated in FIG. 1 OA.

Figure 7A:
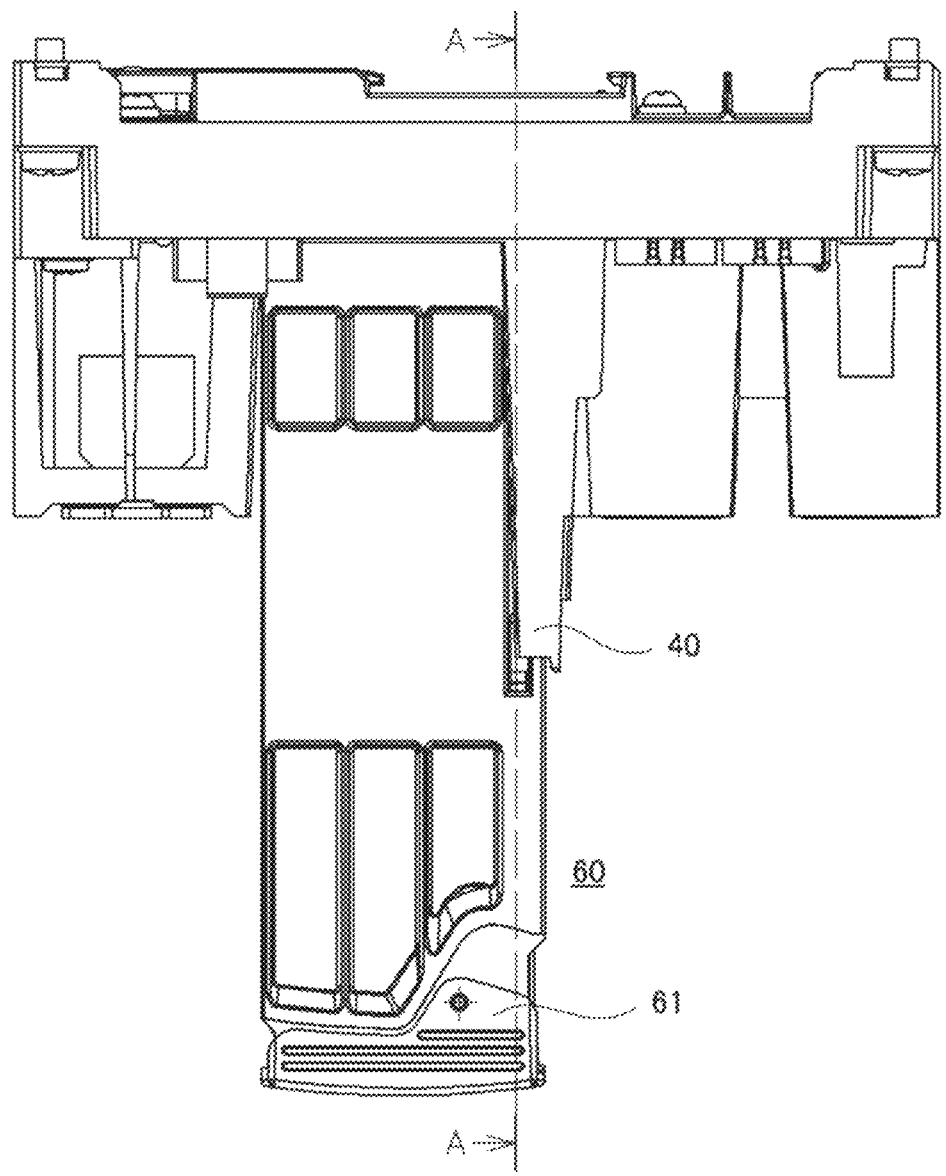
FIG. 7A is a drawing illustrating a top view of the plug-in module 60.
Figure 10A:
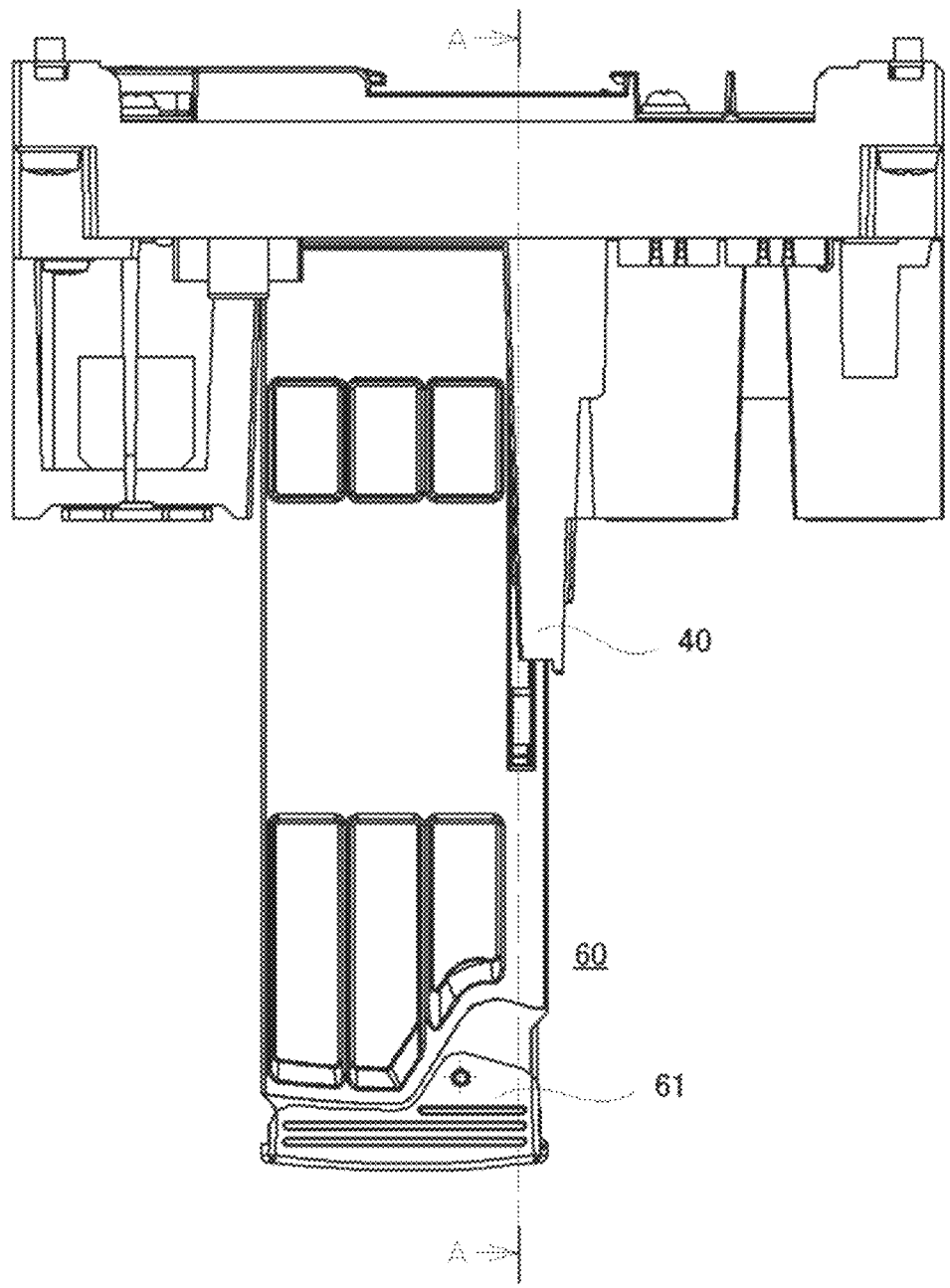
FIG. 10A is a drawing illustrating a top view of the plug-in module 60.
Figure 10B:
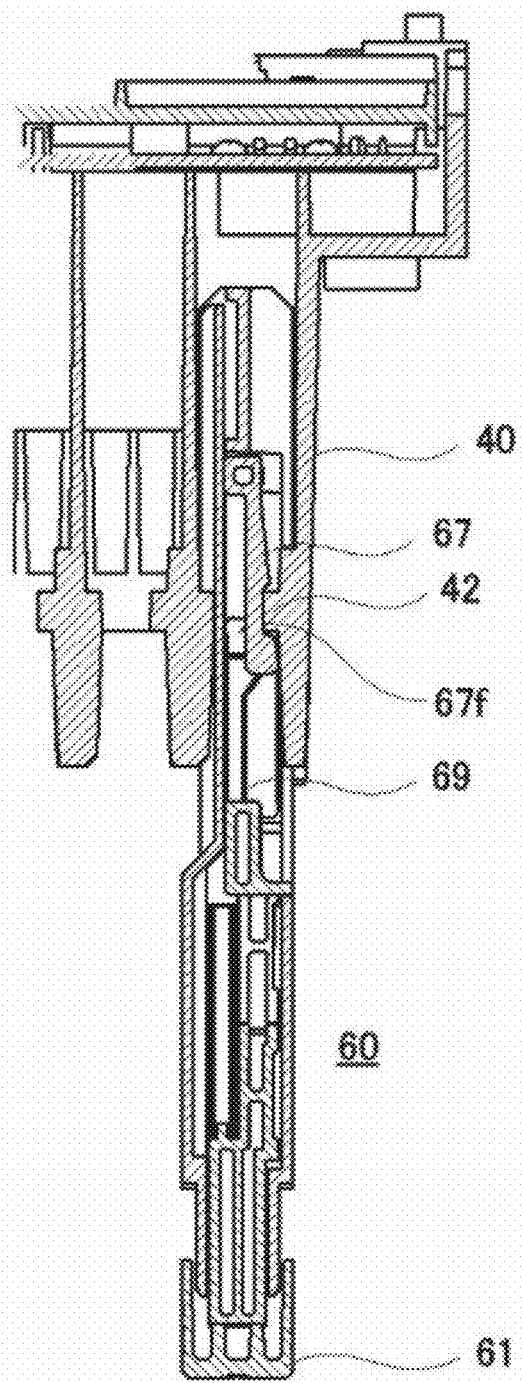
FIG. 10B is a drawing illustrating a sectional view on the line A-A illustrated in FIG. 10A.
Figure 11:
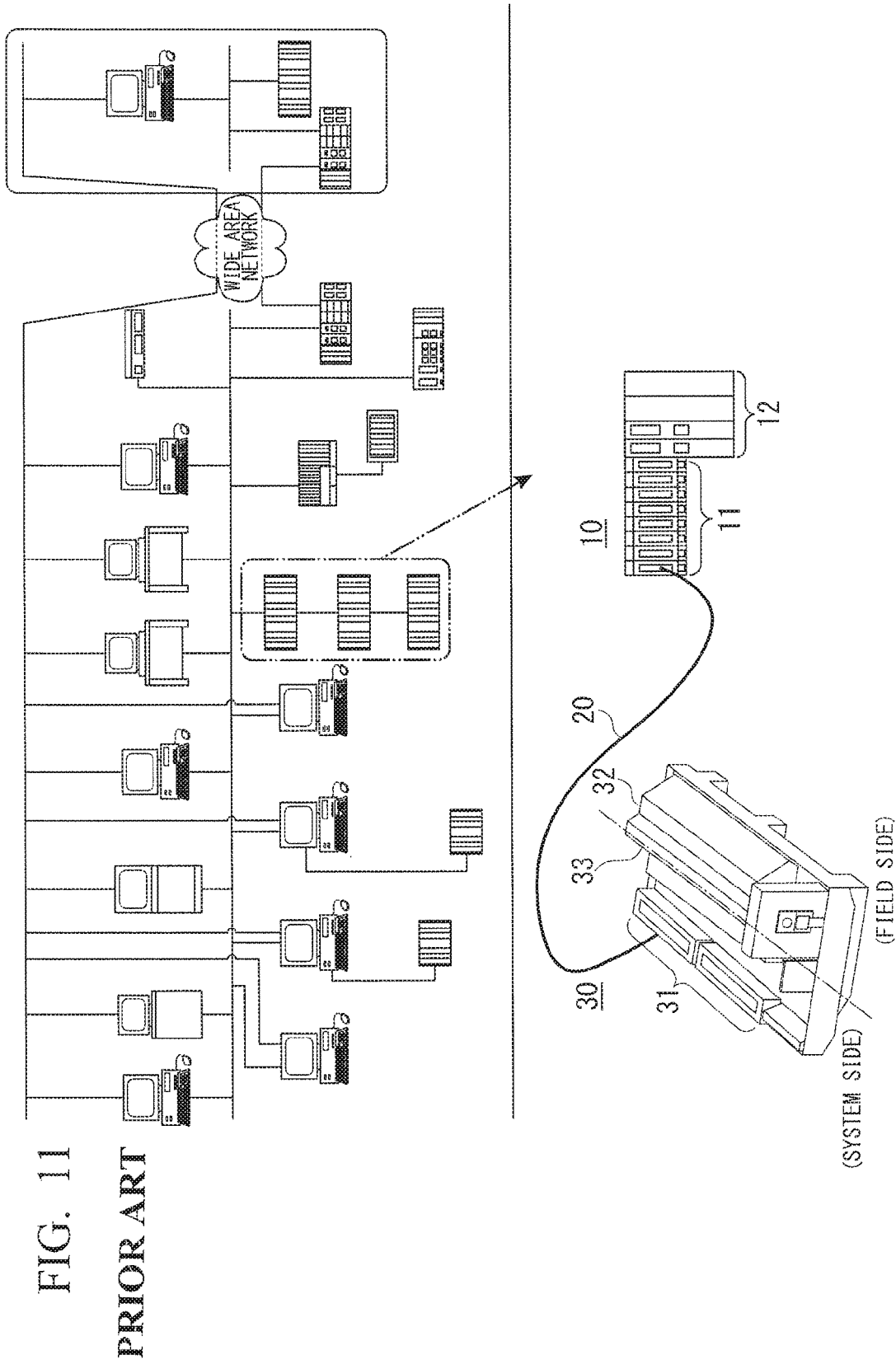
FIG. 11 is a drawing illustrating an example of a control system including the electronic device.
Figure 12:
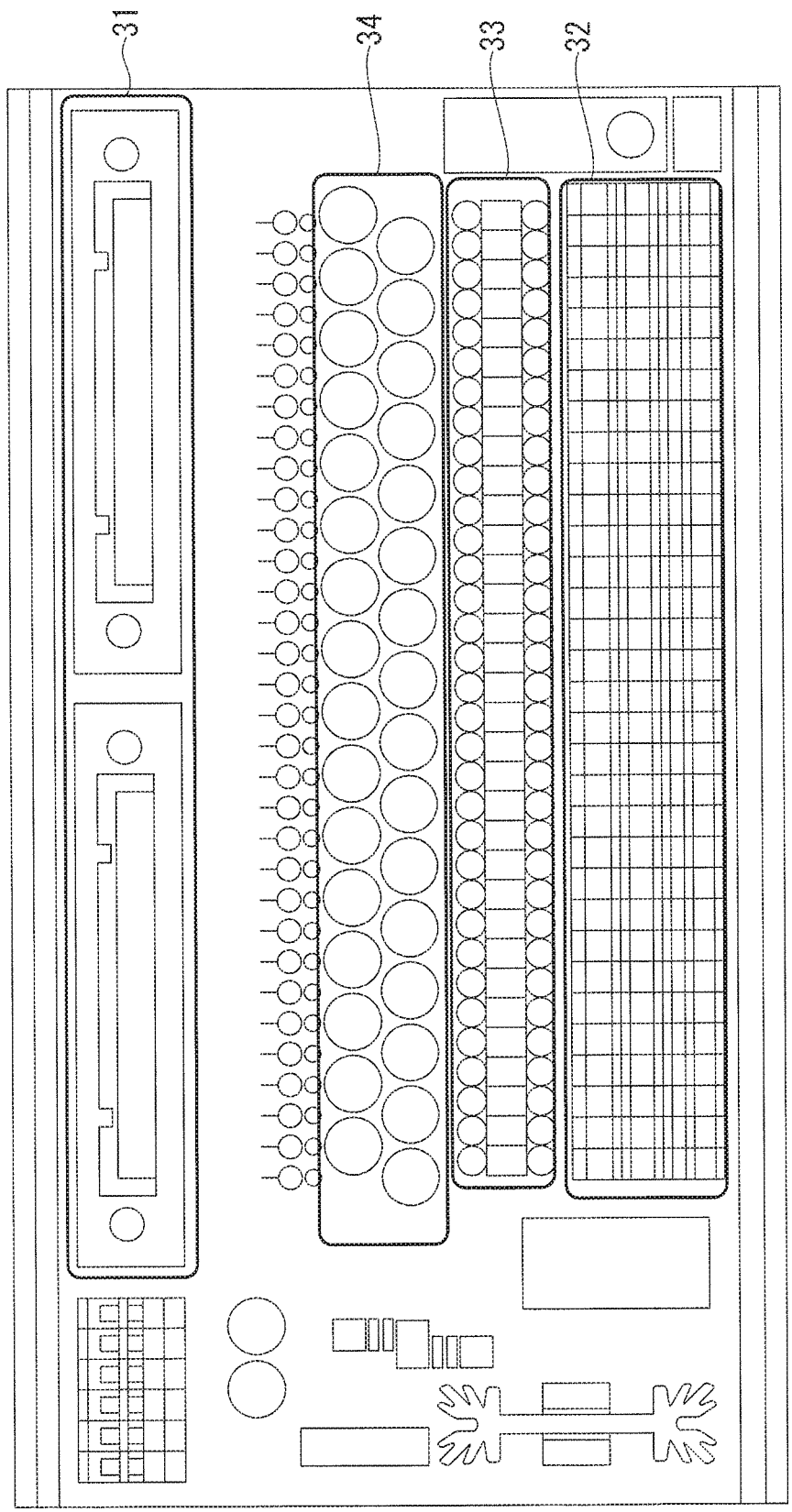
FIG. 12 is a drawing illustrating the second terminal board 30.
Figure 13:
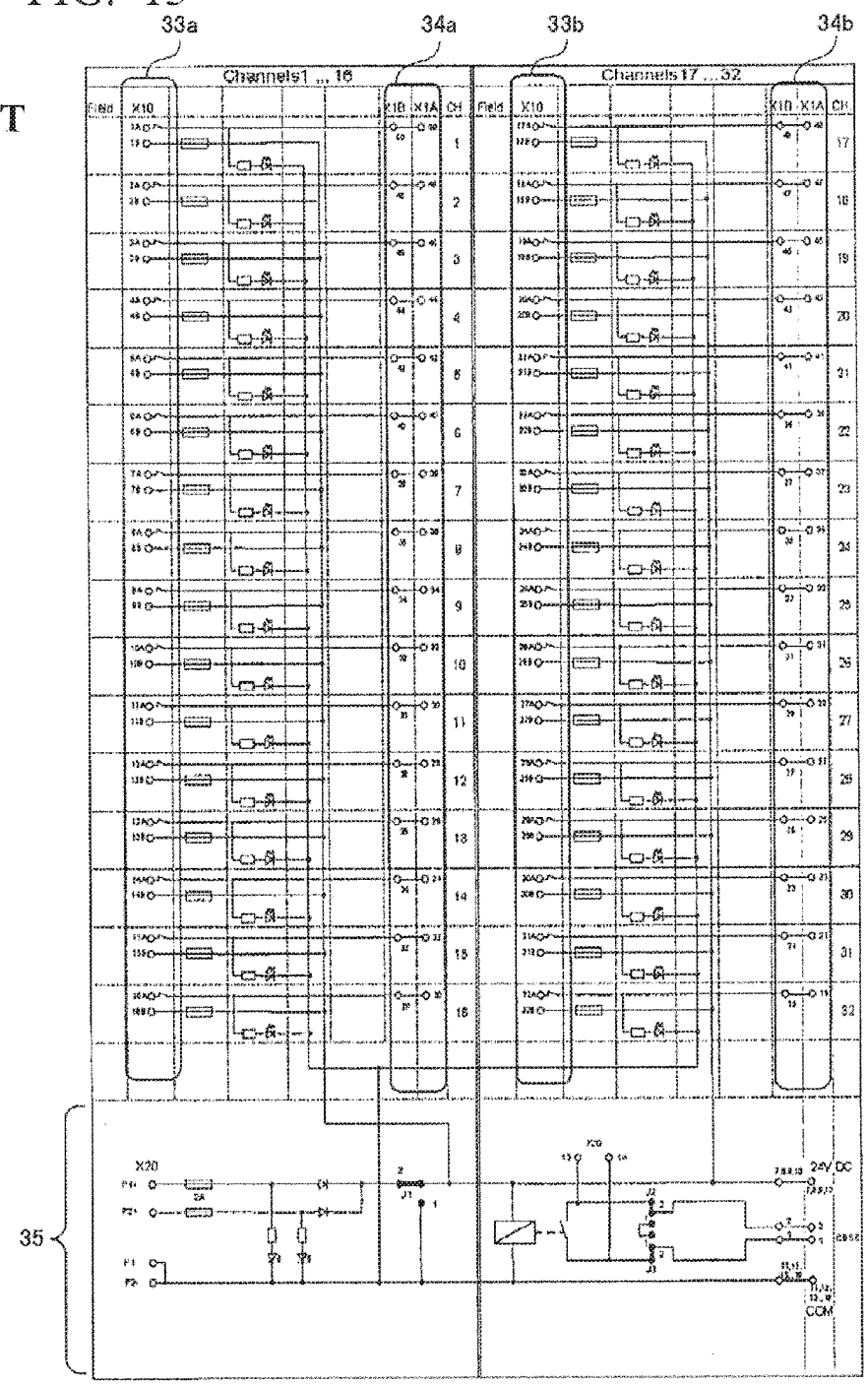
FIG. 13 is a circuit block diagram of the second terminal board 30.
Figure 14A:
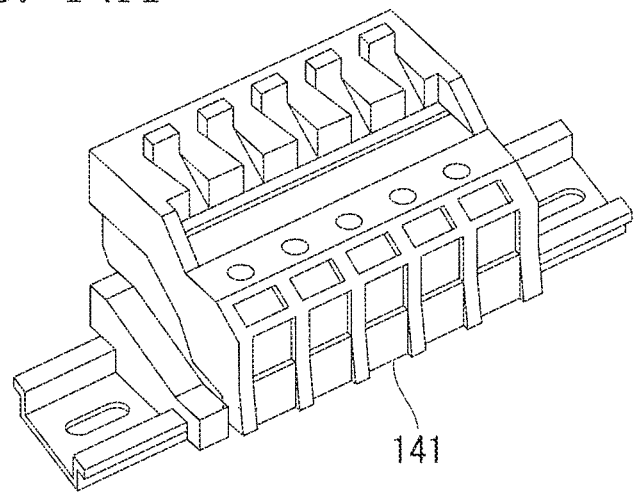
FIG. 14A is a drawing illustrating a terminal block separated from the second terminal board 30.
Figure 14B:
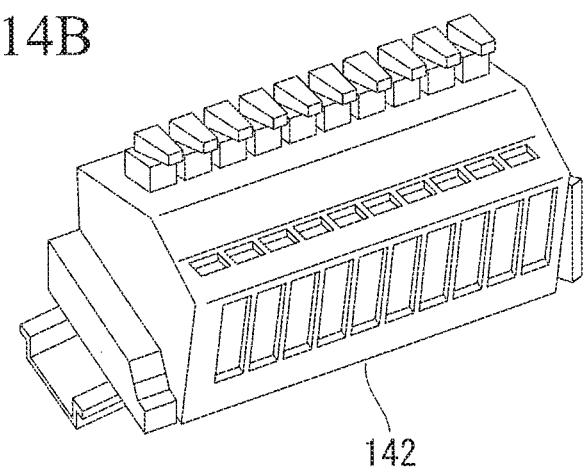
FIG. 14B is a drawing illustrating a terminal block separated from the second terminal board 30.
Figure 14C:
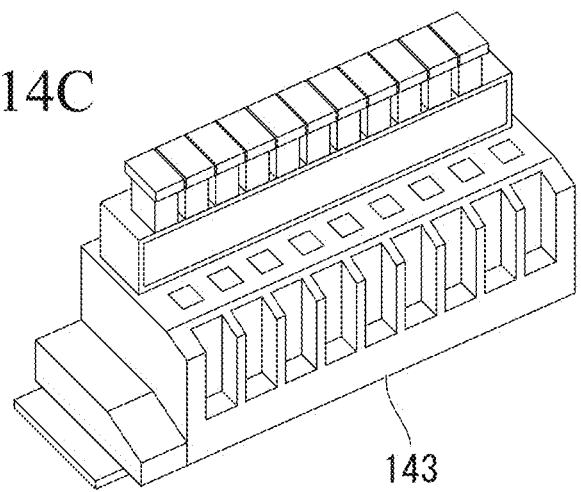
FIG. 14C is a drawing illustrating a terminal block separated from the second terminal board 30.
Figure 14D:
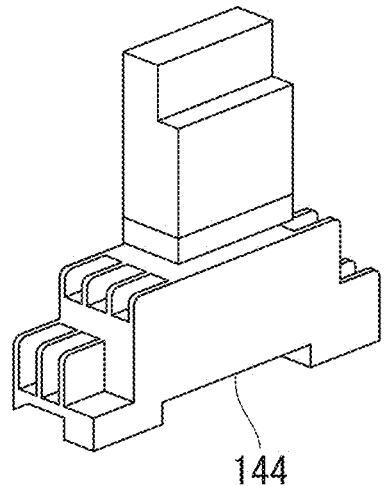
FIG. 14D is a drawing illustrating a terminal block separated from the second terminal board 30.
Figure 14E:
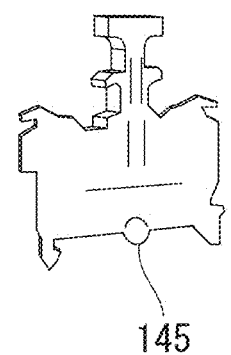
FIG. 14E is a drawing illustrating a terminal block separated from the second terminal board 30.

FIG. 7A trough FIG. 10B are different from FIG. 6 in the intermediate stopper which is formed on the latch 67 of which a movable end is driven in a vertical direction by the connection member 69. However, FIG. 7A trough FIG. 10B are same as FIG. 6 in that the movable end of the latch 67 is driven in the vertical direction in conjunction with the rotation of the front lever 61.

The projection 42 is formed on a facing plane of the baseplate 40 facing to the connection member 69. When the projection 42 engages with the notch 67f, the movement of the latch 67 is stopped.

Figure 7B:
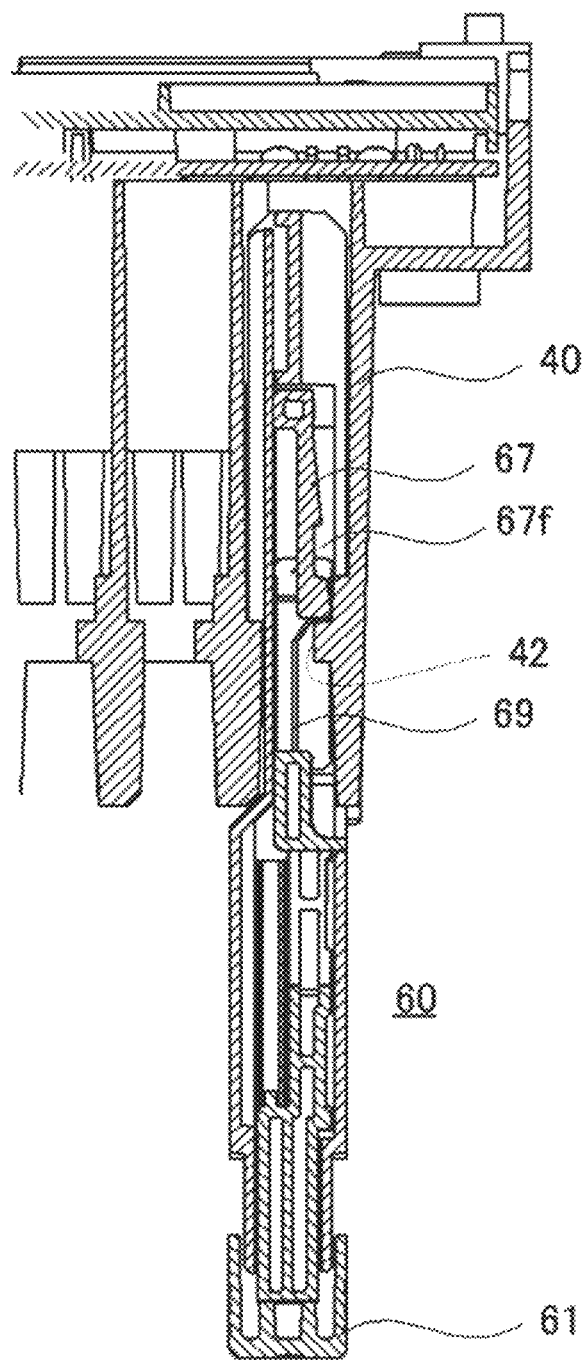
FIG. 7B is a drawing illustrating a sectional view on the line A-A illustrated in FIG. 7A.
Figure 8A:
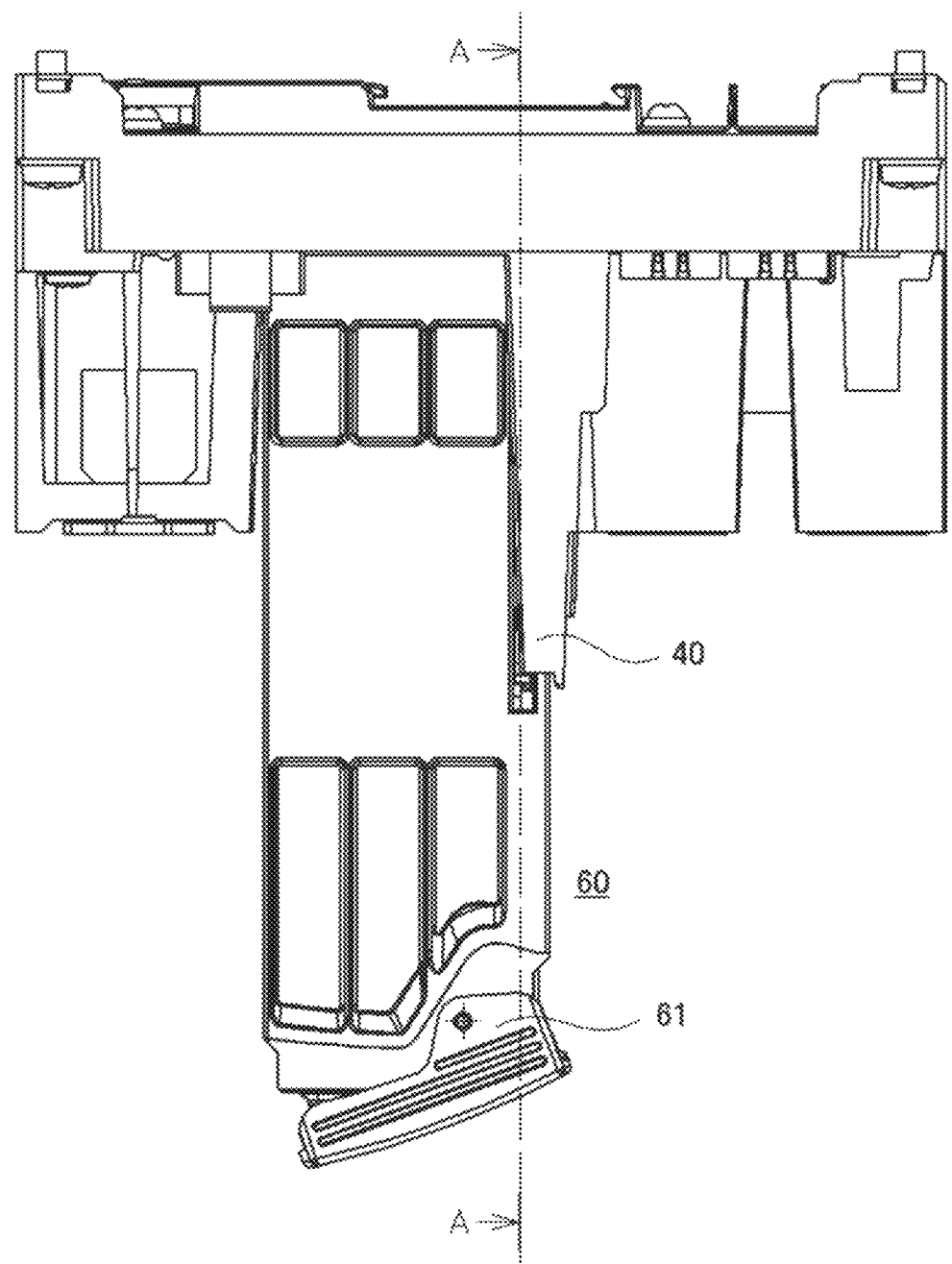
FIG. 8A is a drawing illustrating a top view of the plug-in module 60.
Figure 8B:
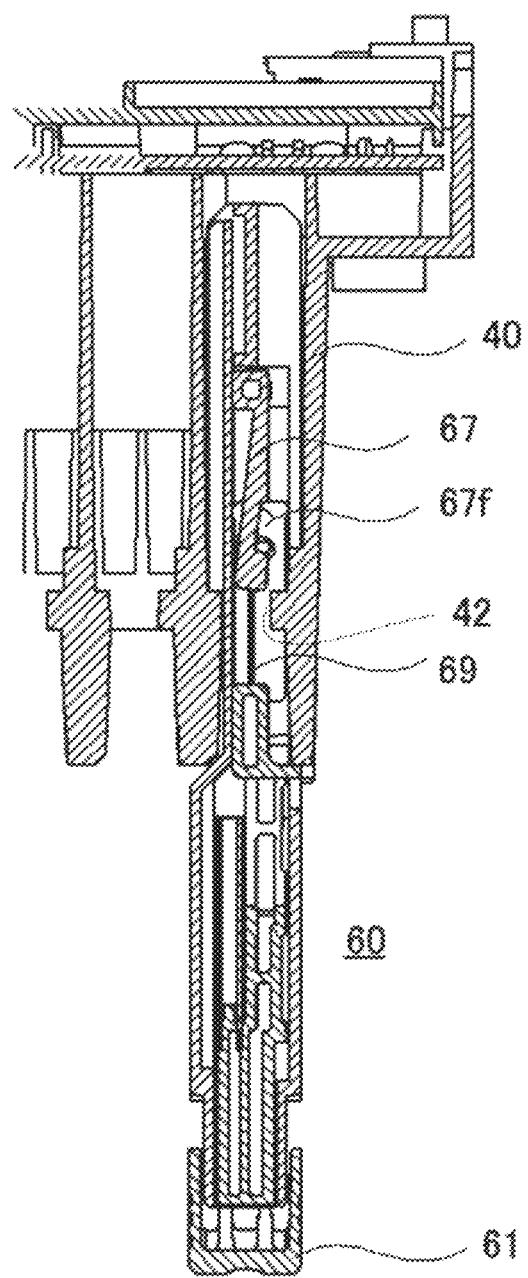
FIG. 8B is a drawing illustrating a sectional view on the line A-A illustrated in FIG. 8A.
Figure 9A:
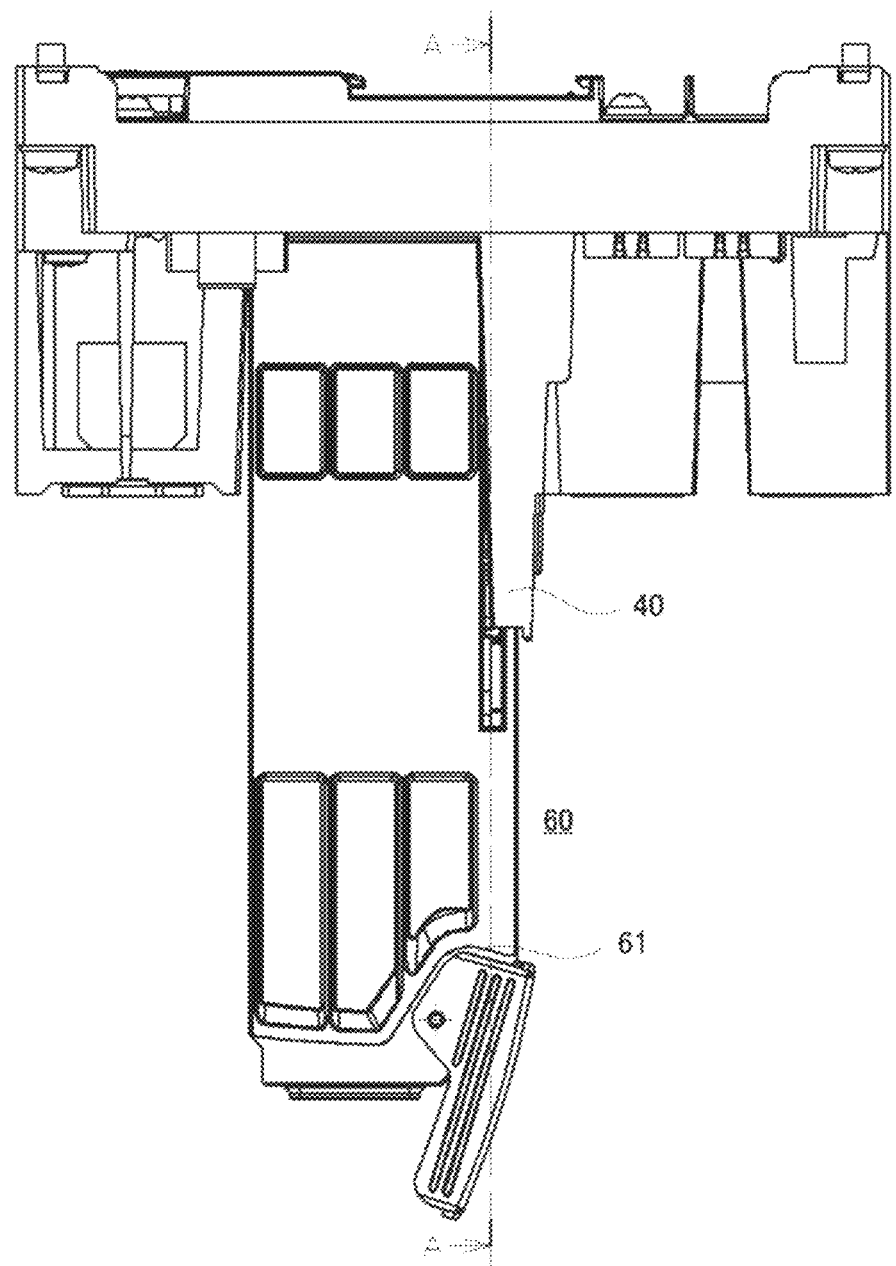
FIG. 9A is a drawing illustrating a top view of the plug-in module 60.
Figure 9B:
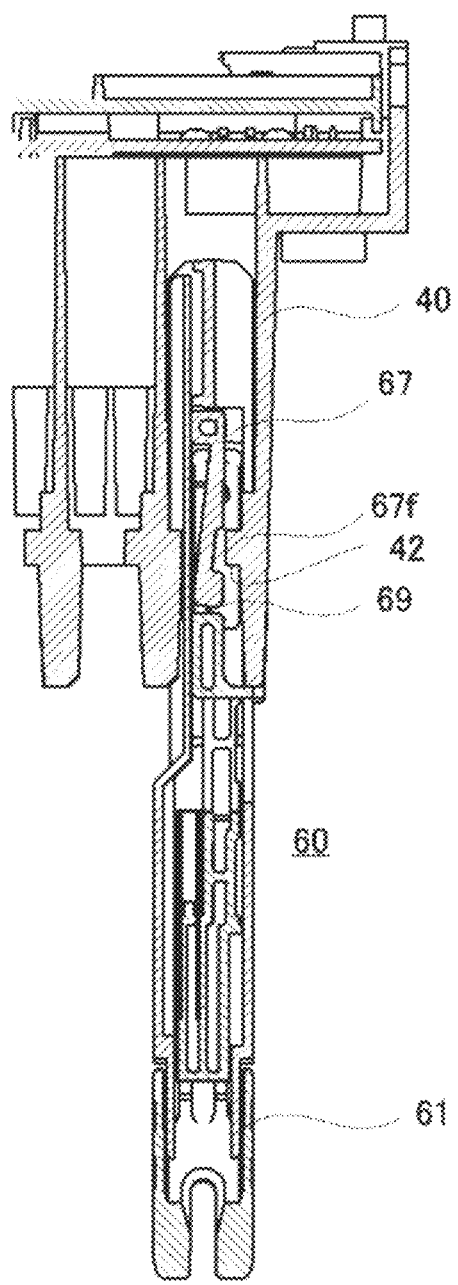
FIG. 9B is a drawing illustrating a sectional view on the line A-A illustrated in FIG. 9A.

FIG. 7A and FIG. 7B represent a stably-engaged connection state in which the plug-in module 60 is inserted to the baseplate 40 and the connectors are engaged with each other stably. FIG. 8A and FIG. 8B represent an ejection starting state in which the front lever 61 is rotated to an opening direction and the plug-in module 60 is tried to be pulled out from the baseplate 40. FIG. 9A and FIG. 9B represent a state in which the plug-in module 60 is pulled out more than FIG. 8A and FIG. 8B. FIG. 10A and FIG. 10B represent a state in which the plug-in module 60 is pulled out more than FIG. 9A and FIG. 9B and the intermediate stopper stops the movement of the plug-in module 60 temporarily.

As shown in FIG. 7A and FIG. 7B, the front lever 61 is closed, and the front lever covers the front of the plug-in module 60. The latch 67 is pressed counterclockwise via the connection member 69. The end plane of the movable end of the latch 67 comes into contact with the side plane of the projection 42 formed on the baseplate 40. Therefore, the plug-in module 60 is fixed to the baseplate 40 stably, and the plug-in module 60 and the baseplate 40 are connected with each other by the connectors (not shown).

As shown in FIG. 7A and FIG. 7B, in a case where the worker tries to pull out the plug-in module 60 from the baseplate 40 in a state that the front lever 61 is closed, the worker cannot pull out the plug-in module 60 because the end plane of the movable end of the latch 67 is in contact with the side plane of the projection 42 formed on the baseplate 40.

As shown in FIG. 8A and FIG. 8B, the front lever 61 is slightly opened counterclockwise from the front of the plug-in module 60. When the front lever is opened, the movable end of the latch 67 is pressed to the downward direction by the connection member 69, and the end plane of the movable end of the latch 67 is not in contact with the side plane of the projection 42 formed on the baseplate 40.

Therefore, the plug-in module 60 becomes a state in which the plug-in module 60 can be pulled out from the baseplate 40. However, as shown in FIG. 8A and FIG. 8B, the plug-in module 60 and the baseplate 40 are kept to be connected with each other by the connectors (not shown).

As shown in FIG. 9A and FIG. 9B, the front lever 61 is widely opened counterclockwise from the front of the plug-in module 60. The connection between the plug-in module 60 and the baseplate 40 with the connectors (not shown) is released. The plug-in module 60 is pulled out to a predetermined intermediate stopping position. At this time, the notch 67f formed in the latch 67 engages with the projection 42 formed on the baseplate 40.

When the front lever 61 is opened widely, the movable end of the latch 67 is pressed clockwise by the connection member 69, and the end plane of the movable end of the latch 67 is not in contact with the side plane of the projection 42 formed on the baseplate 40.

The plug-in module 60 becomes a state in which the plug-in module 60 can be pulled out from the baseplate 40. By pulling out the plug-in module 60 strongly, the connection between the plug-in module 60 and the baseplate 40 with the connectors (not shown) is released, and the plug-in module 60 can be pulled out from the baseplate 40.

FIG. 10A and FIG. 10B represent a state in which the front lever 61 is closed from a state of FIG. 9A and FIG. 9B. As shown in FIG. 10A and FIG. 10B, when the front lever 61 is closed, the projection 42 engages with the notch 67f formed in the latch 67. The plug-in module 60 is held at a predetermined intermediate stopping position in a state that the plug-in module 60 is pulled out.

In a case where pulling out the plug-in module 60 from the baseplate 40, because the plug-in module 60 is temporarily held at the predetermined intermediate stopping position in the state that the plug-in module 60 is pulled out, the plug-in module 60 is not ejected and fallen from the baseplate 40 even if the worker tries to pull out the plug-in module 60 carelessly. Therefore, the constitution can prevent the plug-in module 60 from being fallen and broken, and the worker's safety can be ensured.

Further, by the intermediate stopper, even if the worker pulls out the plurality of the plug-in modules 60, it can be prevented that the worker forgets an original combination of the plug-in module 60 and the baseplate 40 (which plug-in module 60 was inserted to which baseplate 40).

In a case where the intermediate stopper is not formed, at the time of the maintenance, the breakdown of the plug-in module 60 can be prevented by ejecting the all plug-in modules 60 from the baseplates 40 and putting the ejected plug-in modules 60 next to the baseplates 40. However, it is difficult to insert the plug-in modules 60 to the baseplates 40 in accordance with the original combination.

According to at least one of the above-described embodiments, the disconnection function of the signal connection between the system side and the field side is implemented by only the plug-in module without mounting the conventional disconnection components on the system side and the field side. Therefore, the electronic device can be downsized and the costs of the electronic device can be reduced.

Also, in a case of pulling out the plug-in module from the baseplate, the movement of the plug-in module is stopped temporarily before the plug-in module is connected to the connector of the baseplate and after the plug-in module is disconnected from the connector of the baseplate. Therefore, the constitution can prevent the plug-in module from unexpectedly being ejected and fallen, and the worker's safety can be ensured.

As used herein, the following directional terms "forward, rearward, above, downward, right, left, vertical, horizontal, below, transverse, row and column" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, unit or part of a device includes hardware and/or software that is constructed and/or programmed to carry out the desired function.

Moreover, terms that are expressed as "means-plus function" in the claims should include any structure that can be utilized to carry out the function of that part of the present invention.

The term "unit" is used to describe a component, unit or part of a hardware and/or software that is constructed and/or programmed to carry out the desired function. Typical examples of the hardware may include, but are not limited to, a device and a circuit.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. An electronic device comprising:
a plug-in module including a printed substrate on which an electronic circuit is mounted; and
a baseplate to which the plug-in module is detachably connected,
wherein a system side and a field side are connected with each other, and a predetermined option function is included in the plug-in module,
wherein the electronic device further comprises an intermediate stopper which is configured to stop a movement of the plug-in module temporarily before the plug-in module is connected to the baseplate and after the plug-in module is disconnected from the baseplate,
wherein the baseplate has a projection, and
wherein the intermediate stopper is configured to stop the movement of the plug-in module in a state that the intermediate stopper engages with the projection.

2. The electronic device according to claim 1, wherein the predetermined option function is at least one of a signal conversion function, a fuse function, an insulation function, an LED, and a relay.

3. The electronic device according to claim 1, wherein the plug-in module comprises a front lever which is openable and closable, and a connection between the system side and the field side is disconnected selectively in conjunction with a rotation of the front lever.

4. The electronic device according to claim 1, wherein the predetermined option function includes a disconnect function which disconnects a connection between the system side and the field side selectively.

5. The electronic device according to claim 1, further comprising:
a holding mechanism configured to hold the plug-in module on the baseplate by connecting a connector of the plug-in module, which is inserted to the baseplate, and a connector of the baseplate; and
a releasing mechanism configured to release a holding operation of the holding mechanism in a case where the plug-in module is pulled out from the baseplate.

6. The electronic device according to claim 1,
wherein the intermediate stopper is a latch which is movable in conjunction with the rotation of the front lever,
wherein the latch has a notch which is configured to engage with the projection, and
wherein the latch is configured to stop the movement of the plug-in module in a state that the notch engages with the projection.

7. An electronic device comprising:
an input-output module configured to communicate with a host device;
a plug-in module including a printed substrate on which an electronic circuit is mounted, the plug-in module including a predetermined option function;
a terminal block to which a field device is connectable; and
a baseplate to which the input-output module, the plug-in module, and the terminal block are connected,
wherein the electronic device further comprises an intermediate stopper which is configured to stop a movement of the plug-in module temporarily before the plug-in module is connected to the baseplate and after the plug-in module is disconnected from the baseplate,
wherein the baseplate has a projection, and
wherein the intermediate stopper is configured to stop the movement of the plug-in module in a state that the intermediate stopper engages with the projection.

8. The electronic device according to claim 7, wherein the predetermined option function is at least one of a signal conversion function, a fuse function, an insulation function, an LED, and a relay.

9. The electronic device according to claim 7, wherein the plug-in module comprises a front lever configured to be openable and closable, and a connection between the host device and the field device is disconnected in conjunction with a rotation of the front lever.

10. The electronic device according to claim 7, wherein the predetermined option function includes a disconnect function configured to disconnect a connection between the host device and the field device.

11. The electronic device according to claim 9, further comprising a slit-shaped window disposed in the front lever.

12. The electronic device according to claim 11, wherein the window is equipped with a magnifying lens.

13. The electronic device according to claim 9, wherein the plug-in module is disposed between the input-output module and the terminal block.

14. The electronic device according to claim 13, wherein a depth of the input-output module is longer than a depth of the plug-in module, the depth of the plug-in module is longer than a depth of the terminal block, and the front lever opens by rotating from a side of the terminal block to a side of the input-output module.

15. The electronic device according to claim 9, further comprising:
a latch disposed in the plug-in module, the latch moving in conjunction with the front lever; and
a stepped section disposed on the baseplate.

16. The electronic device according to claim 15, wherein
in a case where the lever is closed, the latch comes into contact with the stepped section to prevent the plug-in module from being pulled out from the baseplate, and
in a case where the lever is opened, the latch is out of contact with the stepped section to allow the plug-in module to be pulled out from the baseplate.

17. The electronic device according to claim 9, further comprising:
a latch disposed in the plug-in module, the latch having a notch, the latch moving in conjunction with the front lever; and
a projection disposed on the baseplate, the projection being engageable with the notch.

18. The electronic device according to claim 17, wherein
in a case where the lever is closed, the latch comes into contact with the projection to prevent the plug-in module from being pulled out from the baseplate, and
in a case where the lever is opened, the latch is out of contact with the projection to allow the plug-in module to be pulled out from the baseplate.

19. The electronic device according to claim 17, wherein a front lever is pressed by a spring to be closed.

20. The electronic device according to claim 7,
wherein the intermediate stopper is a latch which is movable in conjunction with the rotation of the front lever,
wherein the latch has a notch which is configured to engage with the projection, and
wherein the latch is configured to stop the movement of the plug-in module in a state that the notch engages with the projection.

* * * * *